(12) United States Patent
Nandakumar (10) Patent No.: US 10,115,638 B2
(45) Date of Patent: Oct. 30, 2018

(54) PARTIALLY RECESSED CHANNEL CORE TRANSISTORS IN REPLACEMENT GATE FLOW

(71) Applicant: Texas Instruments Incorporated, Dallas, TX (US)

(72) Inventor: Mahalingam Nandakumar, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/174,018

(22) Filed: Jun. 6, 2016

(65) Prior Publication Data

US 2016/0284596 A1    Sep. 29, 2016

Related U.S. Application Data

(62) Division of application No. 13/933,237, filed on Jul. 2, 2013.

(51) Int. Cl.
| | |
|---|---|
| H01L 21/02 | (2006.01) |
| H01L 21/8234 | (2006.01) |
| H01L 27/088 | (2006.01) |
| H01L 29/78 | (2006.01) |
| H01L 21/225 | (2006.01) |
| H01L 21/311 | (2006.01) |
| H01L 27/11 | (2006.01) |
| H01L 29/66 | (2006.01) |

(52) U.S. Cl.
CPC ........... *H01L 21/823418* (2013.01); *H01L 21/02164* (2013.01); *H01L 21/02274* (2013.01); *H01L 21/02636* (2013.01); *H01L 21/2254* (2013.01); *H01L 21/31116* (2013.01); *H01L 21/823437* (2013.01); *H01L 21/823456* (2013.01); *H01L 27/088* (2013.01); *H01L 29/6656* (2013.01); *H01L 29/6659* (2013.01); *H01L 29/66621* (2013.01); *H01L 29/7836* (2013.01); *H01L 27/1116* (2013.01); *H01L 29/66545* (2013.01); *H01L 29/66628* (2013.01)

(58) Field of Classification Search
CPC ...... H01L 21/823418; H01L 27/092–27/0928; H01L 21/8238–21/823892
USPC ........................................................ 257/408
See application file for complete search history.

(56) References Cited

U.S. PATENT DOCUMENTS

| | | | |
|---|---|---|---|
| 6,600,195 B1 * | 7/2003 | Nishida | ............. H01L 21/26586 257/335 |
| 7,943,992 B2 | 5/2011 | Sell et al. | |
| 8,030,197 B2 | 10/2011 | Doyle et al. | |

(Continued)

*Primary Examiner* — Eric Ward
*Assistant Examiner* — Eric Ashbahian
(74) *Attorney, Agent, or Firm* — Jacqueline J. Garner; Charles A. Brill; Frank D. Cimino (57) ABSTRACT

An integrated circuit containing MOS transistors with replacement gates may be formed with elevated LDD regions and/or recessed replacement gates on a portion of the transistors. Elevating the LDD regions is accomplished by a selective epitaxial process prior to LDD implant. Recessing the replacement gates is accomplished by etching substrate material after removal of sacrificial gate material and before formation of a replacement gate dielectric layer. Elevating the LDD regions and recessing the replacement gates may increase a channel length of the MOS transistors and thereby desirably increase threshold uniformity of the transistors.

11 Claims, 10 Drawing Sheets

(56) References Cited

U.S. PATENT DOCUMENTS

| | | | |
|---|---|---|---|
| 2008/0102573 A1* | 5/2008 | Liang | H01L 21/823814 438/231 |
| 2008/0135943 A1 | 6/2008 | Chien | |
| 2009/0159966 A1 | 6/2009 | Huang | |
| 2010/0276757 A1* | 11/2010 | Doyle | H01L 21/82345 257/368 |
| 2012/0098072 A1* | 4/2012 | Han | H01L 21/26586 257/402 |
| 2013/0023094 A1 | 1/2013 | Yeh et al. | |
| 2013/0095630 A1* | 4/2013 | Eshun | H01L 21/82341 438/302 |
| 2013/0099309 A1* | 4/2013 | Jang | H01L 27/0266 257/330 |
| 2013/0126949 A1* | 5/2013 | Liao | H01L 29/66636 257/288 |
| 2014/0015014 A1* | 1/2014 | Cheng | H01L 29/167 257/288 |

* cited by examiner

PARTIALLY RECESSED CHANNEL CORE TRANSISTORS IN REPLACEMENT GATE FLOW

CROSS REFERENCE TO RELATED APPLICATIONS

This application is a divisional of U.S. Nonprovisional patent application Ser. No. 13/933,237 filed Jul. 2, 2013, the contents of which are herein incorporated by reference in its entirety.

FIELD OF THE INVENTION

This invention relates to the field of integrated circuits. More particularly, this invention relates to MOS transistors in integrated circuits.

BACKGROUND OF THE INVENTION

An integrated circuit may include metal oxide semiconductor (MOS) transistors formed using a gate replacement process. It may be desirable to increase threshold uniformity in a portion of the MOS transistors without increasing the area occupied by the transistors.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing MOS transistors with replacement gates may be formed with elevated LDD regions and/or recessed replacement gates on a portion of the transistors. Elevating the LDD regions is accomplished by a selective epitaxial process prior to LDD implant. Recessing the replacement gates is accomplished by etching substrate material after removal of sacrificial gate material and before formation of a replacement gate dielectric layer. Elevating the LDD regions and recessing the replacement gates may increase a channel length of the MOS transistors and thereby desirably increase threshold uniformity of the transistors.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing MOS transistors with replacement gates may be formed with elevated LDD regions and/or recessed replacement gates on a portion of the transistors, so that channels and gate dielectric layers extend along both horizontal and vertical surfaces. Elevating the LDD regions is accomplished by a selective epitaxial process prior to LDD implant. Recessing the replacement gates is accomplished by etching substrate material after removal of sacrificial gate material and before formation of a replacement gate dielectric layer. Elevating the LDD regions and recessing the replacement gates may increase a channel length of the MOS transistors and thereby desirably increase threshold uniformity of the transistors without increasing area occupied by the transistors.

Figure 1A:
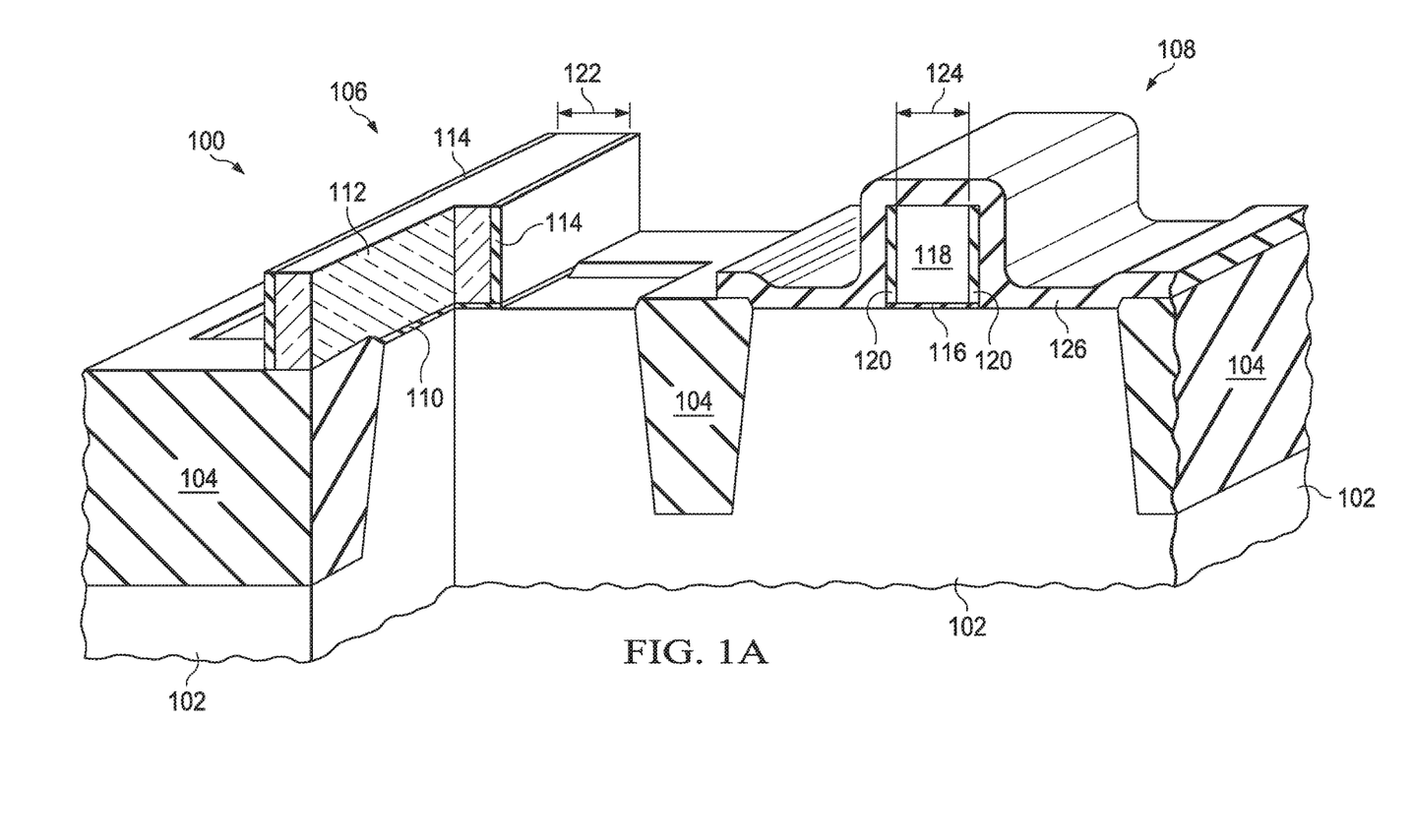
FIG. 1A through FIG. 1H are cross sections of an integrated circuit, depicted in successive stages of fabrication.

FIG. 1A through FIG. 1H are cross sections of an integrated circuit, depicted in successive stages of fabrication. Referring to FIG. 1A, the integrated circuit 100 is formed in and on a semiconductor substrate 102, which may be a single crystal silicon wafer, a silicon-on-insulator (SOI) wafer, a hybrid orientation technology (HOT) wafer with regions of different crystal orientations, or other material appropriate for fabrication of the integrated circuit 100.

Field oxide 104 is formed at a top surface of the substrate 102. The field oxide 104 may be, for example, silicon dioxide between 200 and 400 nanometers thick, formed by a shallow trench isolation (STI) process. An STI process may include the steps of: forming an oxide layer on the substrate 102, forming a silicon nitride layer on the oxide layer, patterning the silicon nitride layer so as to expose an area for the field oxide 104, etching a trench in the substrate 102 in the exposed area to an appropriate depth for a desired thickness of the field oxide 104, growing a layer of thermal oxide on sidewalls and a bottom of the trench, filling the trench with silicon dioxide by chemical vapor deposition (CVD), high density plasma (HDP) or high aspect ratio process (HARP), removing unwanted silicon dioxide from a top surface of the silicon nitride layer, and removing the silicon nitride layer.

The field oxide 104 laterally isolates a first MOS transistor 106 from a second MOS transistor 108. The first MOS transistor 106 and the second MOS transistor 108 have a same polarity. The first MOS transistor 106 may be part of a circuit requiring a narrow range of threshold potentials, such as a static random access memory (SRAM) circuit, or an amplifier circuit. The second MOS transistor 108 may be part of a circuit which may tolerate a wider range of threshold potentials, such as a logic circuit or multiplexer.

The first MOS transistor 106 includes a first sacrificial gate dielectric layer 110 formed at the top surface of the substrate 102, and a first sacrificial gate 112 formed over the first sacrificial gate dielectric layer 110. First offset spacers 114 may be formed on lateral surfaces of the first sacrificial gate 112. Similarly, the second MOS transistor 108 includes a second sacrificial gate dielectric layer 116 formed at the top surface of the substrate 102, and a second sacrificial gate 118 formed over the second sacrificial gate dielectric layer 116. Second offset spacers 120 may be formed on lateral surfaces of the second sacrificial gate 118. In one version of the instant embodiment, a first gate linewidth 122 of the first sacrificial gate 112 is substantially equal to a second gate linewidth 124 of the second sacrificial gate 118. The term "gate linewidth" is to be understood for the purposes of this disclosure to refer to a lateral width of a in a direction of current flow in an MOS transistor containing the gate.

In an alternate version, the first gate linewidth 122 of the first sacrificial gate 112 is 80 to 90 percent of the second gate linewidth 124 of the second sacrificial gate 118.

The first sacrificial gate dielectric layer 110 and the second sacrificial gate dielectric layer 116 may be, for example, 1 to 10 nanometers of silicon dioxide which is deposited or thermally grown. The first sacrificial gate 112 and the second sacrificial gate 118 may be, for example, polycrystalline silicon, commonly referred to as polysilicon, patterned using a hard mask and a reactive ion etch (ME) process. The first offset spacers 114 and second offset spacers 120 may be, for example, 1 to 10 nanometers of silicon nitride, conformally deposited by plasma enhanced chemical vapor deposition (PECVD) using ammonia and bis (tertiary-butylamino) silane (BTBAS).

An epi-block layer 126 is formed over the second MOS transistor 108 so as to cover the top surface of the substrate 102 adjacent to the second sacrificial gate 118. The epi-block layer 126 may be, for example, 10 to 50 nanometers of silicon dioxide, conformally deposited by PECVD using oxygen and tetraethyl orthosilicate, also known as tetra-ethoxysilane or TEOS. The epi-block layer 126 is patterned so as to expose the first MOS transistor 106.

Figure 1B:
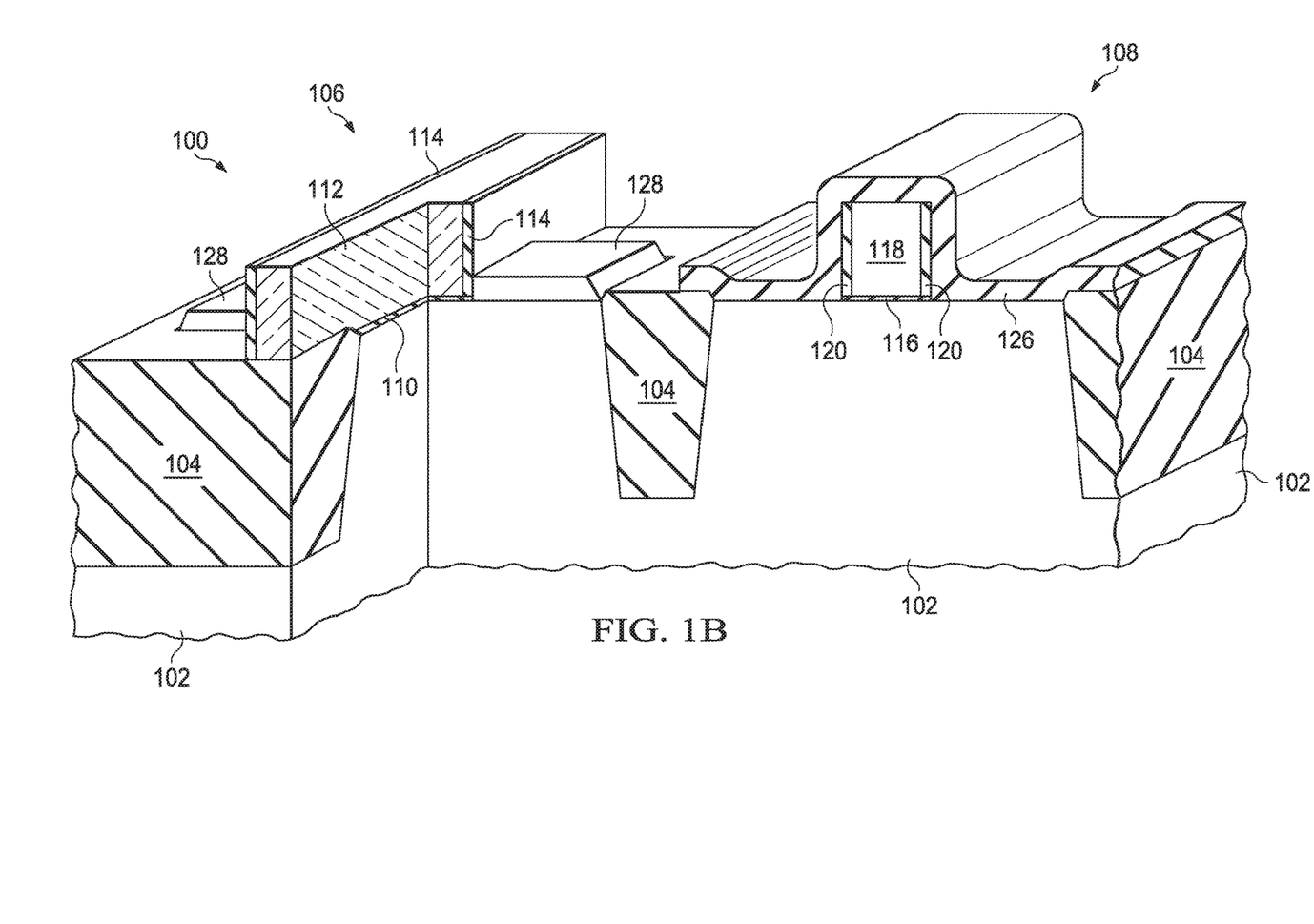

Referring to FIG. 1B, a selective epitaxial growth process is performed which forms elevated LDD semiconductor regions 128 of semiconductor material, for example, crystalline silicon, on the substrate 102 adjacent to the first sacrificial gate 112. The selective epitaxial growth process may include reduction of silane, dichlorosilane or tetrachlorosilane by hydrogen and hydrogen chloride at 800° C. to 1200° C. A top surface of the elevated LDD semiconductor regions 128 may be, for example, 2 to 10 nanometers above the top surface of the substrate 102. Significant amounts of semiconductor material are not formed on the field oxide 104 or the epi-block layer 126 by the selective epitaxial growth process.

Figure 1C:
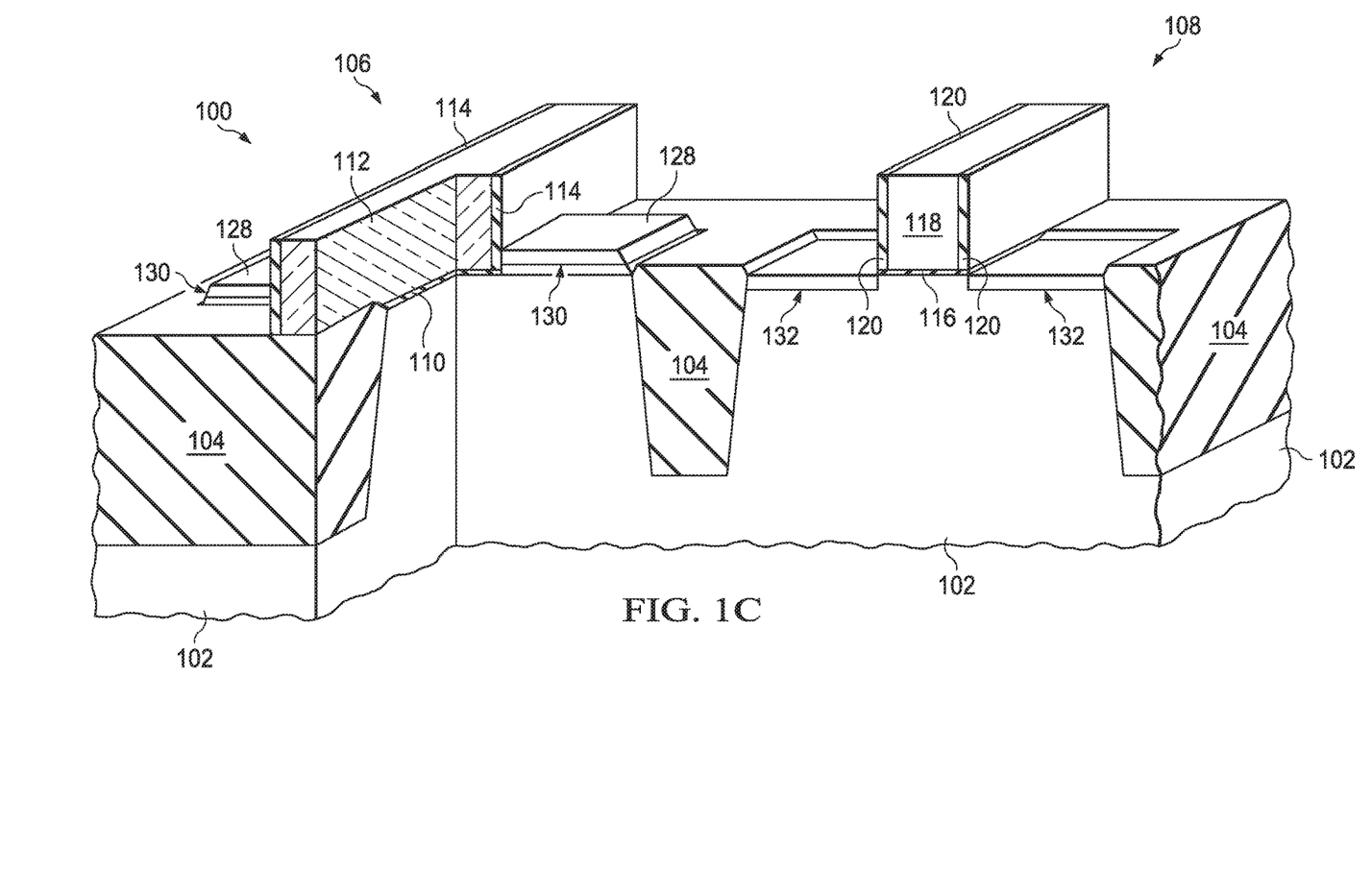

Referring to FIG. 1C, the epi-block layer 126 is removed, for example using an RIE process with a fluorine-containing plasma. Subsequently, an LDD implant process is performed which implants dopants into the elevated LDD semiconductor regions 128 in the first MOS transistor 106 to form first LDD implanted regions 130. Concurrently, the LDD implant process implants the dopants into the substrate 102 adjacent to the second sacrificial gate 118 to form second LDD implanted regions 132 in the second MOS transistor 108.

Figure 1D:
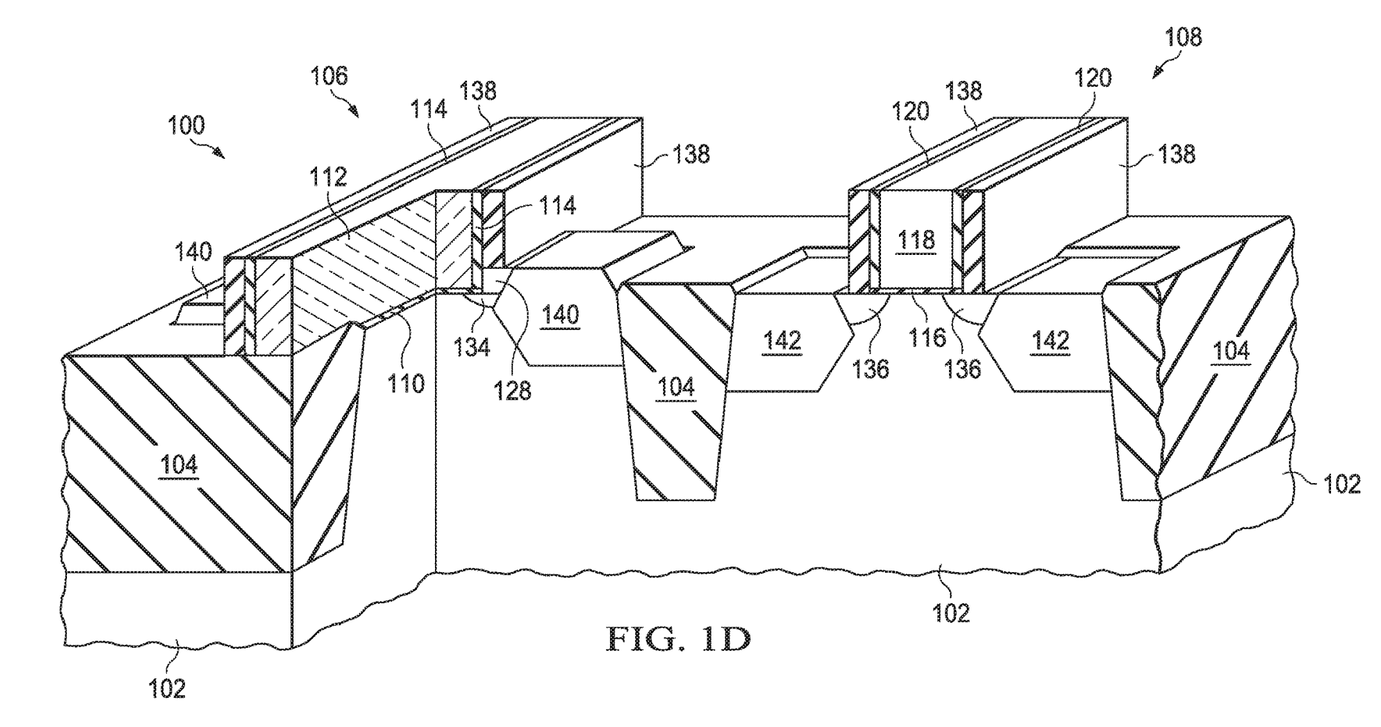

Referring to FIG. 1D, the integrated circuit 100 is annealed so that the dopants in the first LDD implanted regions 130 and the second LDD implanted regions 132 are activated so as to form elevated first LDD regions 134 and second LDD regions 136 in the substrate 102 adjacent to the first sacrificial gate 112 and the second sacrificial gate 118, respectively. A top surface of the elevated first LDD regions 134 may be, for example, 2 to 10 nanometers above the top surface of the substrate 102. Source/drain spacers 138 are formed adjacent to the first sacrificial gate 112 and the second sacrificial gate 118. The source/drain spacers 138 may be, for example, 10 to 30 nanometers of silicon dioxide.

First epitaxial source and drain regions 140 and second epitaxial source and drain regions 142 may be formed in the first MOS transistor 106 and the second MOS transistor 108, respectively. The first epitaxial source and drain regions 140 and the second epitaxial source and drain regions 142 may be formed, for example, by removing semiconductor material from the elevated LDD semiconductor regions 128 and the substrate 102 adjacent to the source/drain spacers 138, and forming epitaxial semiconductor material with a different stoichiometry in the region where the semiconductor material from the elevated LDD semiconductor regions 128 and the substrate 102 was removed. The elevated first LDD regions 134 provide drain extensions for the first epitaxial source and drain regions 140; similarly, the second LDD regions 136 provide drain extensions for the second epitaxial source and drain regions 142.

Figure 1E:
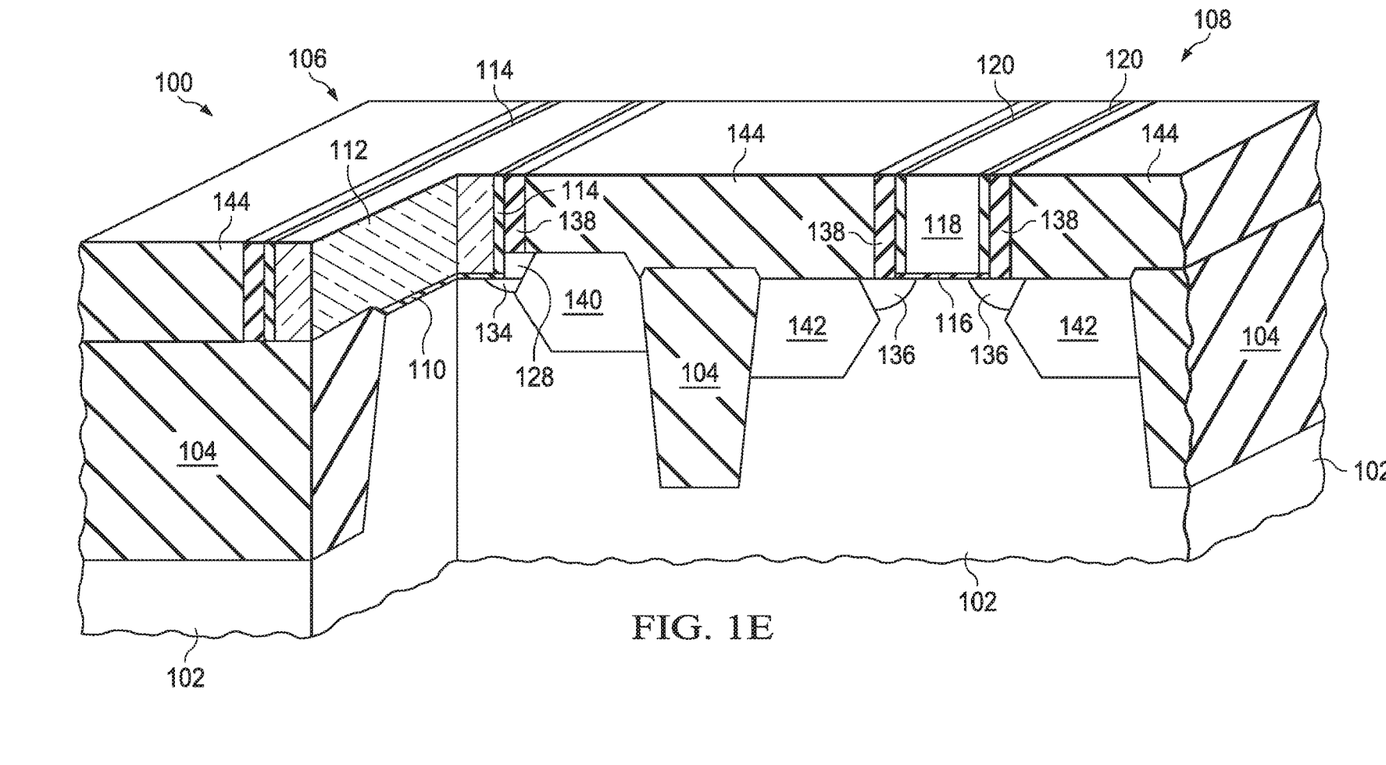

Referring to FIG. 1E, a dielectric layer 144 is formed over the integrated circuit 100 so as to cover areas adjacent to the first sacrificial gate 112 and the second sacrificial gate 118 and to expose top surfaces of the first sacrificial gate 112 and the second sacrificial gate 118. The dielectric layer 144 may be formed, for example, by depositing a conformal layer of silicon dioxide by PECVD using TEOS or a spin-on process using methylsilsesquioxane (MSQ), or by depositing silicon dioxide using an HDP process. The conformal layer of silicon dioxide may subsequently be planarized using a chemical mechanical polish (CMP) process and/or an etch-back process such as a resist etchback process, so as to expose the top surfaces of the first sacrificial gate 112 and the second sacrificial gate 118 while leaving the dielectric layer 144 covering the areas adjacent to the first sacrificial gate 112 and the second sacrificial gate 118.

Figure 1F:
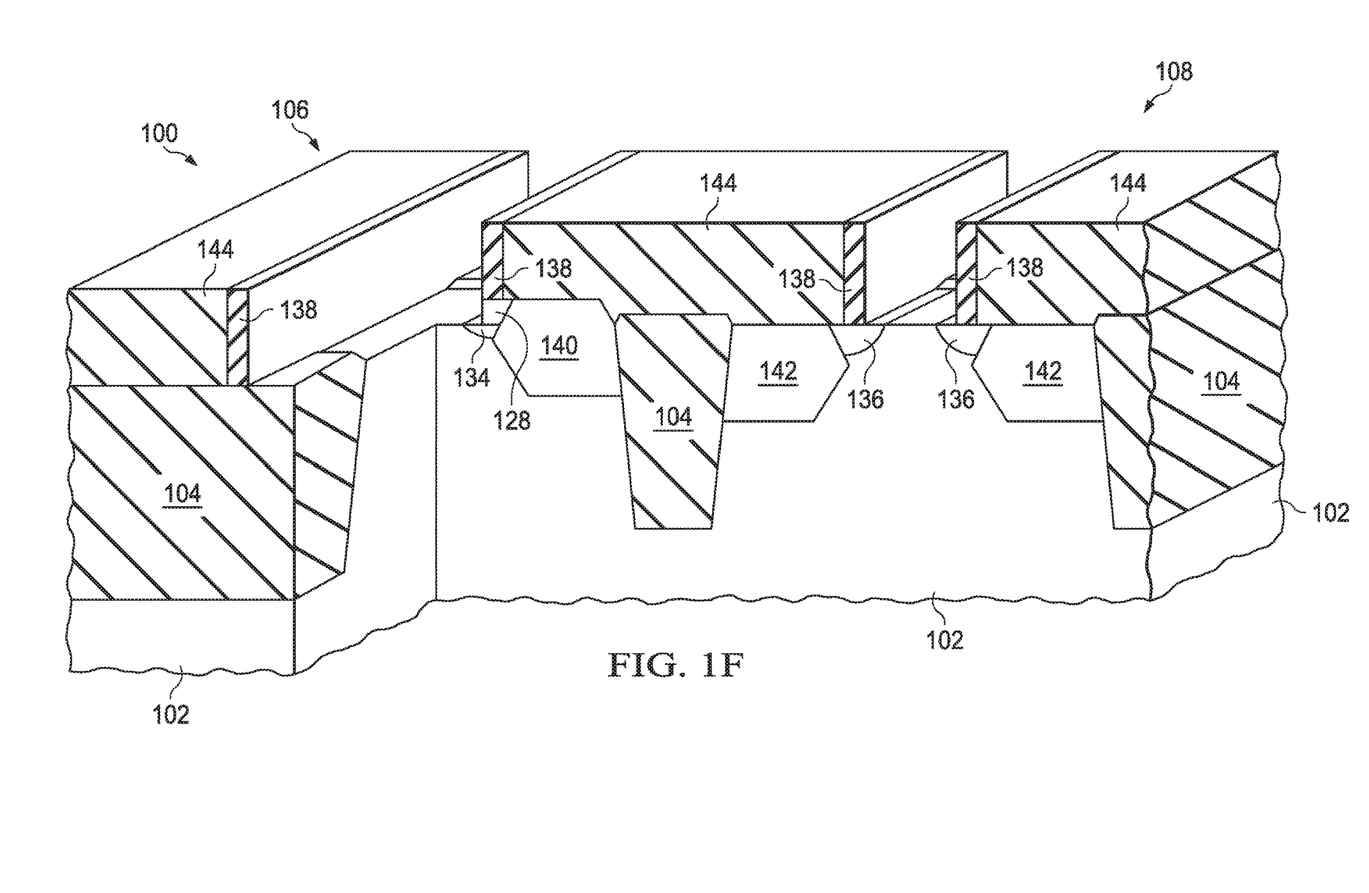

Referring to FIG. 1F, the first sacrificial gate 112 and the second sacrificial gate 118 of FIG. 1E are removed, for example using a dry etch or a wet etch that is selective to the first sacrificial gate dielectric layer 110 and the second sacrificial gate dielectric layer 116. Subsequently, the first sacrificial gate dielectric layer 110 and the second sacrificial gate dielectric layer 116 of FIG. 1E are removed, for example using another dry etch or a wet etch that is selective to the substrate 102. The first offset spacers 114 and second offset spacers 120 of FIG. 1E may also be removed, for example using an isotropic plasma etch that is selective to the source/drain spacers 138.

Figure 1G:
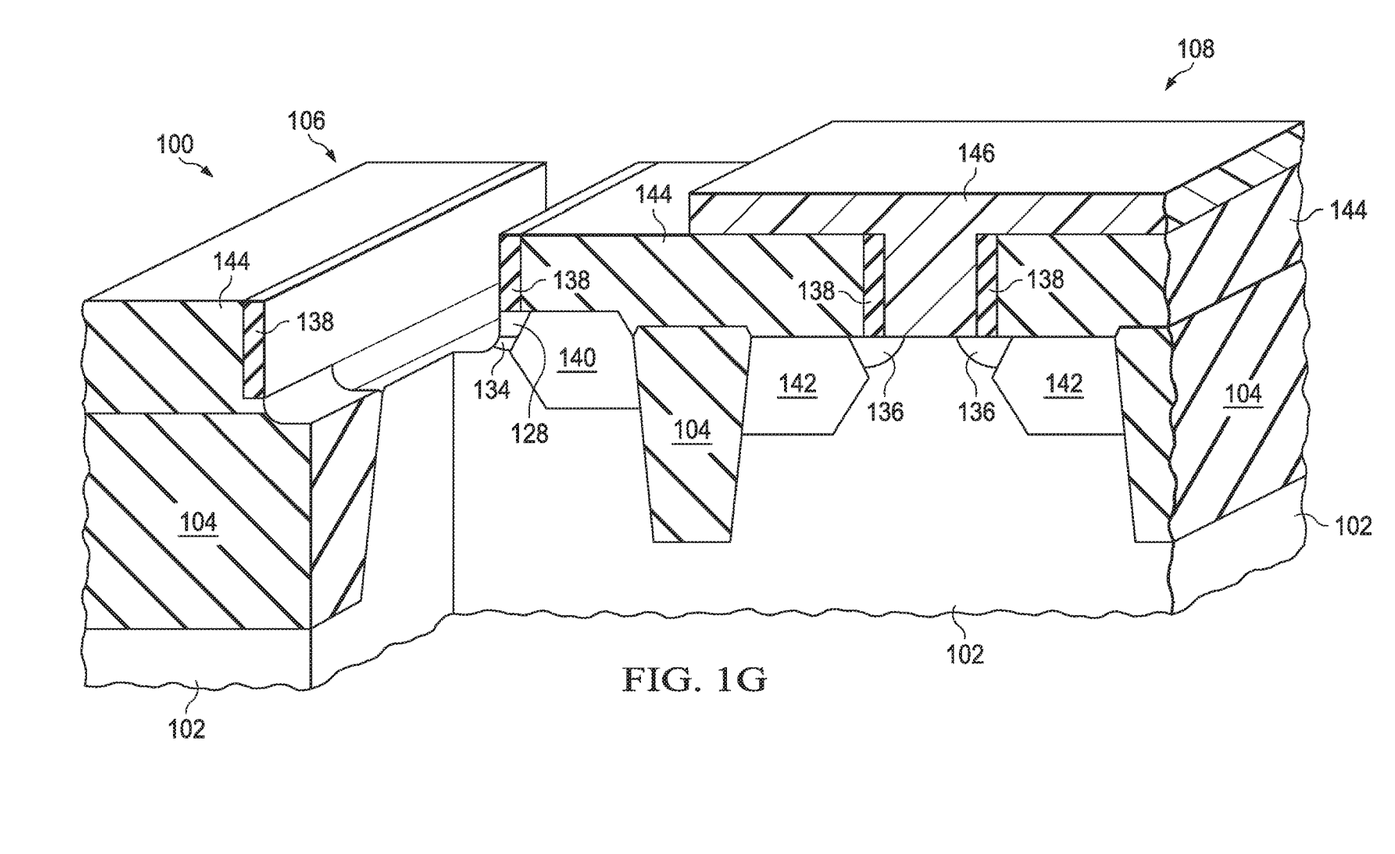

Referring to FIG. 1G, an etch mask 146 is formed over the substrate 102 in the second MOS transistor 108 located under the second sacrificial gate 118 of FIG. 1E, so as to expose the substrate 102, and possibly the field oxide 104, in the first MOS transistor 106 located under the first sacrificial gate 112 of FIG. 1E. The etch mask 146 may include, for example, photoresist and be formed by a photolithographic process.

Subsequently, a gate recess etch is performed which removes semiconductor material from the substrate 102, and the field oxide 104 if exposed, located under the first sacrificial gate 112. The gate recess etch is performed so that an etched surface of the substrate 102 is substantially coplanar with an etched surface of the field oxide 104. The gate recess etch is further performed so that divots are avoided, for example at edges of the source/drain spacers 138 and at boundaries between the field oxide 104 and the substrate 102. The gate recess etch may, for example, include a plasma using $CF_4$ and argon, and optionally $O_2$. Another possible gate recess etch may include a plasma using $SF_6$, $O_2$ and argon. The gate recess etch may be performed in two steps, in which the substrate 102 is etched faster than the field oxide 104 in one step and vice versa in another step. $O_2$ flow may be adjusted to attain a desired etch rate of the substrate 102. In an alternate version of the instant embodiment, the gate recess etch may include, for example, an isotropic plasma etch using $NF_3$, $SF_6$ and $CHF_3$. In one version of the instant embodiment, 2 to 50 nanometers of semiconductor material may be removed. In another version, 3 to 10 nanometers of semiconductor material may be removed. The etch mask 146 is removed after the gate recess etch is completed.

Figure 1H:
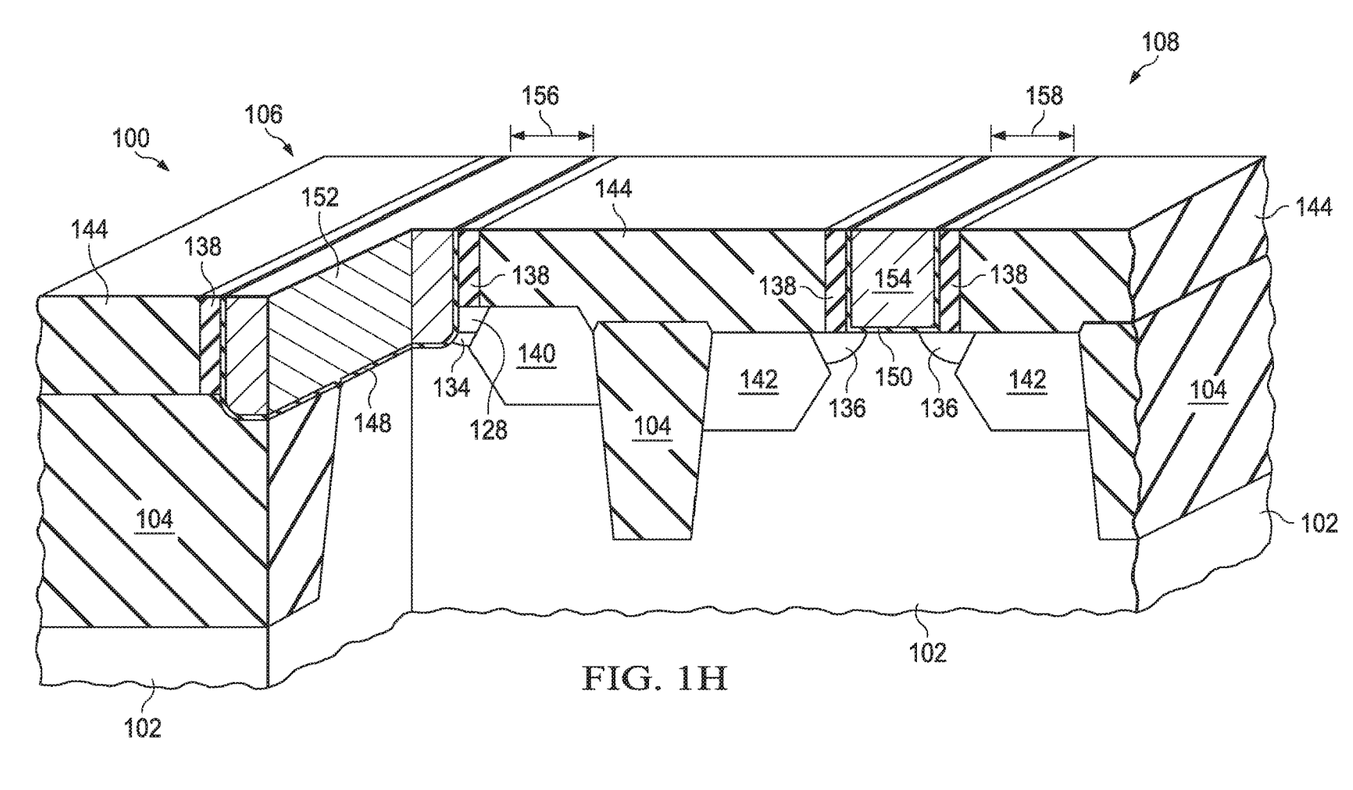

Referring to FIG. 1H, a first replacement gate dielectric layer 148 and a second replacement gate dielectric layer 150 are formed concurrently on the substrate 102 in the first MOS transistor 106 and the second MOS transistor 108, respectively. A surface of the substrate 102 under the first replacement gate dielectric layer 148 is substantially coplanar with a surface of the field oxide under the first replacement gate dielectric layer 148. The first replacement gate dielectric layer 148 and the second replacement gate dielectric layer 150 have substantially equal composition. Subsequently, a recessed first replacement gate 152 and a second replacement gate 154 are formed concurrently on the first replacement gate dielectric layer 148 and the second replacement gate dielectric layer 150, respectively. In one version of the instant embodiment, the recessed first replacement gate 152 is recessed 2 to 50 nanometers below the top surface of the substrate 102. In another version, the recessed first replacement gate 152 is recessed 3 to 10 nanometers. The recessed first replacement gate 152 and the second replacement gate 154 have substantially equal composition and structure. The recessed first replacement gate dielectric layer 148 and the second replacement gate dielectric layer 150 may have, for example, high dielectric coefficients and include tantalum oxide, hafnium oxide and/or zirconium oxide. The recessed first replacement gate 152 and the second replacement gate 154 may include, for example, titanium nitride. The first replacement gate dielectric layer 148, the second replacement gate dielectric layer 150, the recessed first replacement gate 152 and the second replacement gate 154 may be formed, for example, by depositing a conformal layer of gate dielectric material, depositing replacement gate material on the layer of gate dielectric material, and subsequently removing the gate dielectric material and the replacement gate material from over the dielectric layer 144. In one version of the instant embodiment, a first replacement gate linewidth 156 of the recessed first replacement gate 152 is substantially equal to a second replacement gate linewidth 158 of the second replacement gate 154. In an alternate version, the first replacement gate linewidth 156 of the recessed first replacement gate 152 is 80 to 90 percent of the second replacement gate linewidth 158 of the second replacement gate 154.

A channel length of the first MOS transistor 106 is longer than a channel length of the second MOS transistor 108, due to the elevated first LDD regions 134 and the recessed first replacement gate 152, which may desirably provide the first MOS transistor 106 with a threshold potential closer to a desired value than the second MOS transistor 108. A channel of the first MOS transistor 106 is extends along both a horizontal and a vertical surface; a channel of the second MOS transistor 108 extends along a horizontal surface and not a vertical surface.

Figure 2:
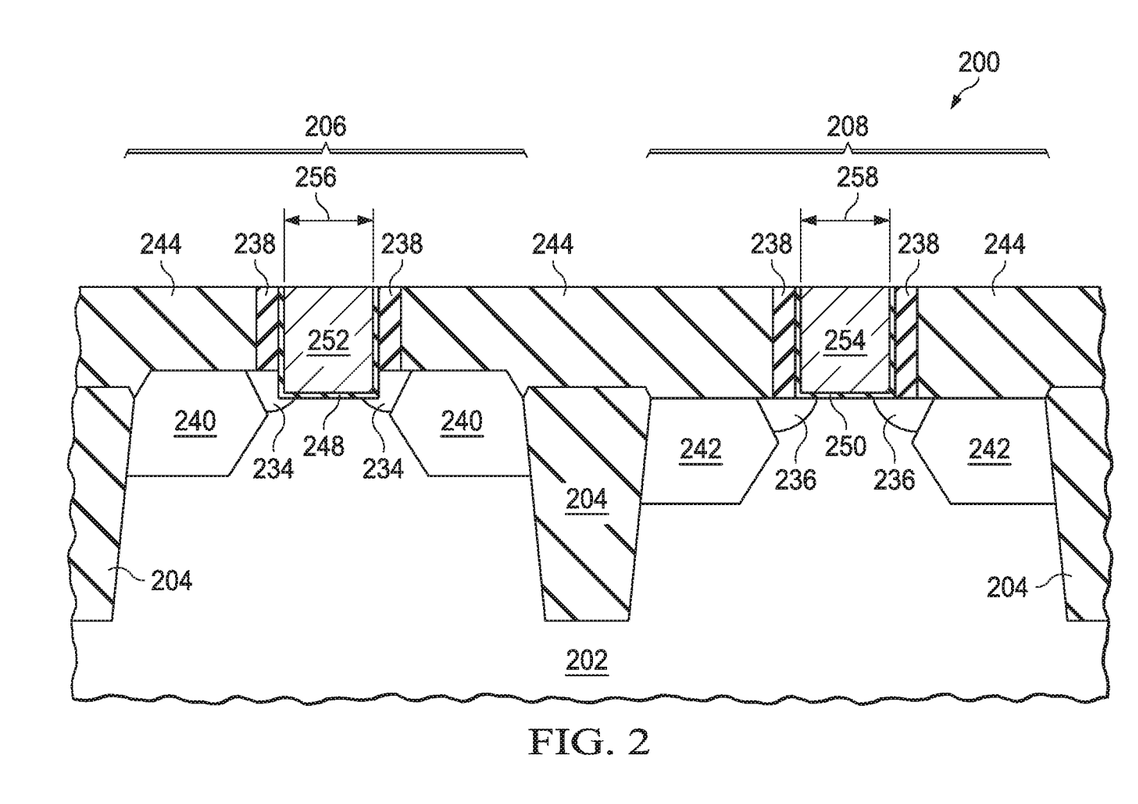
FIG. 2 is a cross section of an integrated circuit containing an MOS transistor with elevated LDD regions.

FIG. 2 is a cross section of an integrated circuit containing an MOS transistor with elevated LDD regions. The integrated circuit 200 is formed in and on a semiconductor substrate 202, for example as described in reference to FIG. 1A. Field oxide 204 is formed at a top surface of the substrate 202, for example as described in reference to FIG. 1A. The integrated circuit 200 includes a first MOS transistor 206 and a second MOS transistor 208. The first MOS transistor 206 and the second MOS transistor 208 have a same polarity.

The first MOS transistor 206 includes elevated first LDD regions 234, formed for example as described in reference to the elevated first LDD regions 134 of FIG. 1A through FIG. 1D. The second MOS transistor 208 includes second LDD regions 236 which are not elevated, formed for example as described in reference to the second LDD regions 136 of FIG. 1A through FIG. 1D.

The first MOS transistor 206 may include first epitaxial source and drain regions 240 and the second MOS transistor may include second epitaxial source and drain regions 242, formed concurrently as described in reference to FIG. 1D. The first MOS transistor 206 includes a first replacement gate dielectric layer 248 on the substrate 202 and a first replacement gate 252 formed on the first replacement gate dielectric layer 248. The second MOS transistor 208 includes a second replacement gate dielectric layer 250 on the substrate 202 and a second replacement gate 254 formed on the second replacement gate dielectric layer 250. The first replacement gate 252 and the second replacement gate 254 are not recessed. The first replacement gate dielectric layer 248, the second replacement gate dielectric layer 250, the first replacement gate 252 and the second replacement gate 254 may be formed, for example, as described in reference to the second replacement gate dielectric layer 250 and the second replacement gate 254 of FIG. 1H. In one version of the instant embodiment, a first replacement gate linewidth 256 of the first replacement gate 252 is substantially equal to a second replacement gate linewidth 258 of the second replacement gate 254. In an alternate version, the first replacement gate linewidth 256 of the first replacement gate 252 is 80 to 90 percent of the second replacement gate linewidth 258 of the second replacement gate 254.

A channel length of the first MOS transistor 206 is longer than a channel length of the second MOS transistor 208, due to the elevated first LDD regions 234, which may desirably provide the first MOS transistor 206 with a threshold potential closer to a desired value than the second MOS transistor 208. Forming the first MOS transistor 206 with the elevated first LDD regions 234 and without a recessed replacement gate may provide a desired threshold value for the first MOS transistor 206 while providing a desired cost and complexity of a fabrication sequence for the integrated circuit 200.

Figure 3:
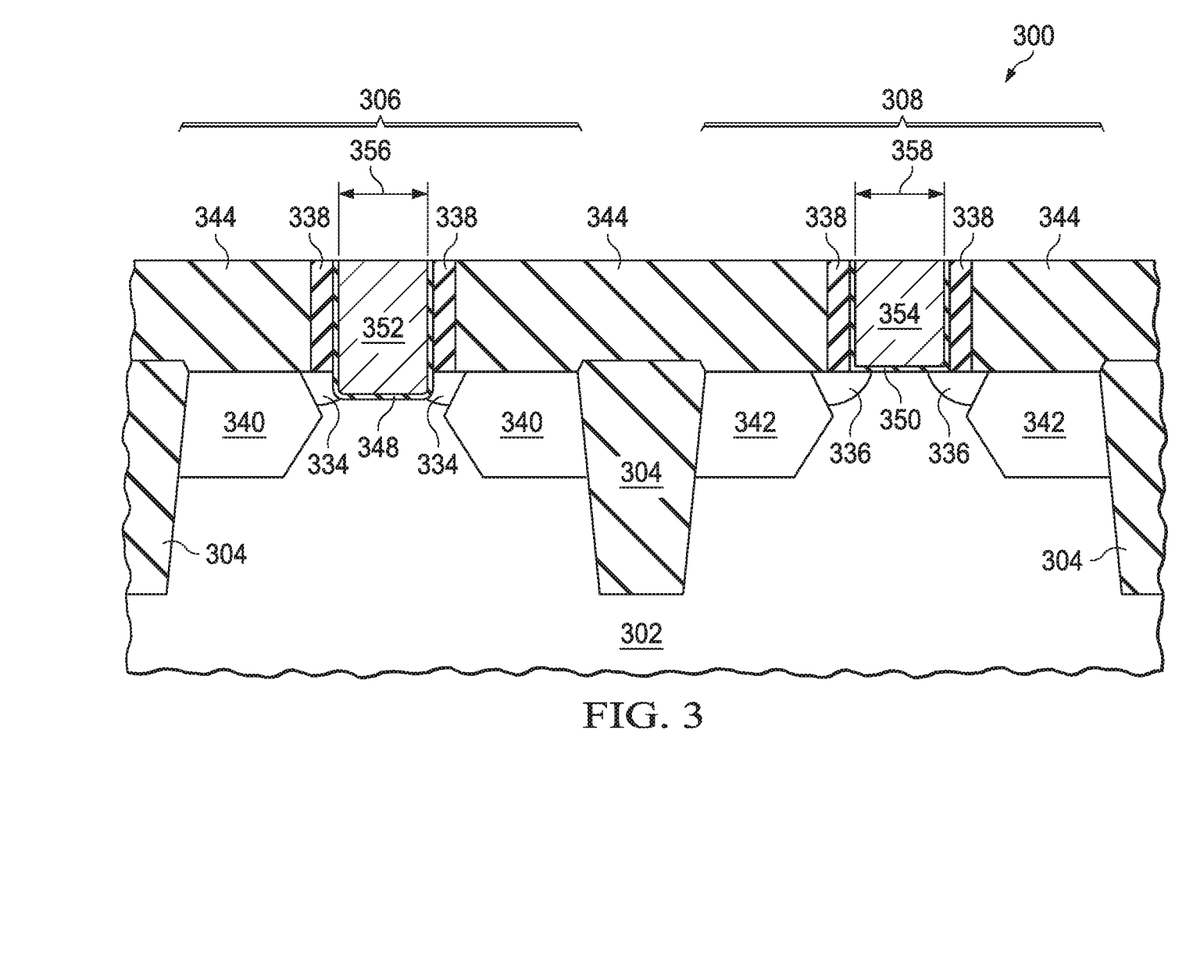
FIG. 3 is a cross section of an integrated circuit containing an MOS transistor with a recessed replacement gate.

FIG. 3 is a cross section of an integrated circuit containing an MOS transistor with a recessed replacement gate. The integrated circuit 300 is formed in and on a semiconductor substrate 302, for example as described in reference to FIG. 1A. Field oxide 304 is formed at a top surface of the substrate 302, for example as described in reference to FIG. 1A. The integrated circuit 300 includes a first MOS transistor 306 and a second MOS transistor 308. The first MOS transistor 306 and the second MOS transistor 308 have a same polarity.

The first MOS transistor 306 includes first LDD regions 334 which are not elevated and the second MOS transistor 308 includes second LDD regions 336 which are not elevated, formed for example as described in reference to the second LDD regions 136 of FIG. 1C and FIG. 1D. The first MOS transistor 306 may include first epitaxial source and drain regions 340 and the second MOS transistor may include second epitaxial source and drain regions 342, formed concurrently as described in reference to FIG. 1D.

The first MOS transistor 306 includes a first replacement gate dielectric layer 348 and a recessed first replacement gate 352 formed on the first replacement gate dielectric layer 348. The first replacement gate dielectric layer 348 and the recessed first replacement gate 352 may be formed, for example, as described in reference to the first replacement gate dielectric layer 148 and the recessed first replacement gate 152 of FIG. 1G and FIG. 1H. The second MOS transistor 308 includes a second replacement gate dielectric layer 350 on the substrate 302 and a second replacement gate 354 formed on the second replacement gate dielectric layer 350. The second replacement gate 354 is not recessed. The second replacement gate dielectric layer 350 and the second replacement gate 354 may be formed, for example, as described in reference to the second replacement gate dielectric layer 150 and the second replacement gate 154 of FIG. 1H. In one version of the instant embodiment, a first replacement gate linewidth 356 of the recessed first replacement gate 352 is substantially equal to a second replacement gate linewidth 358 of the second replacement gate 354. In an alternate version, the first replacement gate linewidth 356 of the recessed first replacement gate 352 is 80 to 90 percent of the second replacement gate linewidth 358 of the second replacement gate 354.

A channel length of the first MOS transistor 306 is longer than a channel length of the second MOS transistor 308, due to the recessed first replacement gate 352, which may desirably provide the first MOS transistor 306 with a threshold potential closer to a desired value than the second MOS transistor 308. Forming the first MOS transistor 306 with the recessed first replacement gate 352 and without elevated LDD regions may provide a desired threshold value for the first MOS transistor 306 while providing a desired cost and complexity of a fabrication sequence for the integrated circuit 300.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps of:
   providing a substrate comprising semiconductor material;
   concurrently removing a first sacrificial gate in a first MOS transistor and removing a second sacrificial gate in a second MOS transistor;
   concurrently removing a first sacrificial gate dielectric layer in said first MOS transistor and removing a second sacrificial gate dielectric layer in said second MOS transistor;
   forming an etch mask over said substrate in said second MOS transistor so as to expose said substrate in said first MOS transistor;
   concurrently removing semiconductor material from said substrate in an area for a recessed replacement gate in said first MOS transistor and from a field oxide adjacent to the area to form a recess, such that an etched surface of said substrate is substantially coplanar with an etched surface of field oxide adjacent to said etched surface of said substrate at a bottom of said recess, and such that semiconductor material is not removed from said substrate in said second MOS transistor;
   concurrently forming a first replacement gate dielectric layer in said first MOS transistor and forming a second replacement gate dielectric layer in said second MOS transistor; and
   concurrently forming a recessed first replacement gate on said first replacement gate dielectric layer and forming a second replacement gate on said second replacement gate dielectric layer;
   so that said recessed first replacement gate is recessed below a top surface of said substrate and said first MOS transistor and said second MOS transistor have a same polarity.

2. The method of claim 1, in which a first replacement gate linewidth of said recessed first replacement gate is substantially equal to a second replacement gate linewidth of said second replacement gate.

3. The method of claim 1, in which a first replacement gate linewidth of said recessed first replacement gate is 80 to 90 percent of a second replacement gate linewidth of said second replacement gate.

4. The method of claim 1, further comprising the steps:
   forming an epi-block layer over said second MOS transistor so as to cover said substrate adjacent to said second sacrificial gate and expose said substrate adjacent to said first sacrificial gate;
   forming elevated LDD semiconductor regions adjacent to said first sacrificial gate by a selective epitaxial growth process while said epi-block layer is in place, so that elevated LDD semiconductor regions are not formed adjacent to said second sacrificial gate;
   removing said epi-block layer; and
   subsequently implanting dopants into said elevated LDD semiconductor regions to form first LDD implanted regions into said substrate adjacent to said second sacrificial gate to form second LDD implanted regions, before said step of concurrently removing said first sacrificial gate and said second sacrificial gate, so that said second LDD implanted regions are not elevated.

5. The method of claim 1, in which said first MOS transistor is part of an SRAM circuit.

6. The method of claim 1, in which said second MOS transistor is part of a logic circuit.

7. A method of forming an integrated circuit, comprising the steps of:
   forming an epi-block layer over a second MOS transistor area so as to cover a substrate adjacent to a second sacrificial gate in the second MOS transistor area and expose the substrate adjacent to a first sacrificial gate in a first MOS transistor area;
   forming elevated LDD semiconductor regions adjacent to the first sacrificial gate by a selective epitaxial growth process while the epi-block layer is in place, so that elevated LDD semiconductor regions are not formed adjacent to the second sacrificial gate;
   removing said epi-block layer;
   subsequently implanting dopants into the elevated LDD semiconductor regions to form first LDD implanted regions and into the substrate adjacent to the second sacrificial gate to form second LDD implanted regions, so that the second LDD implanted regions are not elevated;
   removing the first sacrificial gate and the second sacrificial gate;
   removing a first sacrificial gate dielectric layer in the first MOS transistor area and removing a second sacrificial gate dielectric layer in the second MOS transistor area;

forming an etch mask over the second MOS transistor area so as to expose a substrate in the first MOS transistor area;

concurrently removing semiconductor material from the substrate in an area for a recessed replacement gate in the first MOS transistor area and from a field oxide adjacent to the area to form a recess, such that a surface of the substrate is substantially coplanar with a surface of field oxide at a bottom of the recess, and such that semiconductor material is not removed from the substrate in the second MOS transistor area;

removing the etch mask;

forming a first replacement gate dielectric layer in the first MOS transistor area and forming a second replacement gate dielectric layer in the second MOS transistor area; and forming a recessed first replacement gate on the first replacement gate dielectric layer and forming a second replacement gate on the second replacement gate dielectric layer, wherein the recessed first replacement gate is recessed below a top surface of said substrate.

8. The method of claim 7, in which a first replacement gate linewidth of said recessed first replacement gate is substantially equal to a second replacement gate linewidth of said second replacement gate.

9. The method of claim 7, in which a first replacement gate linewidth of the recessed first replacement gate is 80 to 90 percent of a second replacement gate linewidth of the second replacement gate.

10. The method of claim 7, in which the first MOS transistor is part of an SRAM circuit.

11. The method of claim 10, in which the second MOS transistor is part of a logic circuit.

* * * * *